United States Patent [19]
Licata

[11] Patent Number: 6,132,564
[45] Date of Patent: Oct. 17, 2000

[54] IN-SITU PRE-METALLIZATION CLEAN AND METALLIZATION OF SEMICONDUCTOR WAFERS

[75] Inventor: Thomas J. Licata, Mesa, Ariz.

[73] Assignee: Tokyo Electron Limited, Tokyo, Japan

[21] Appl. No.: 08/971,512

[22] Filed: Nov. 17, 1997

[51] Int. Cl.[7] .................................................. C23C 14/34
[52] U.S. Cl. ............................... 204/192.15; 204/192.17; 204/192.25; 204/192.3; 204/298.35; 216/37
[58] Field of Search .......................... 204/192.15, 192.17, 204/192.25, 192.3, 298.25, 192.32, 192.13, 298.35, 298.05; 438/582; 216/37

[56] References Cited

U.S. PATENT DOCUMENTS

| | | |
|---|---|---|
| Re. 34,106 | 10/1992 | Ohmi . |
| 3,594,295 | 7/1971 | Meckel et al. . |
| 4,250,009 | 2/1981 | Cuomo et al. . |
| 4,464,223 | 8/1984 | Gorin . |
| 4,585,517 | 4/1986 | Stemple ................................. 156/643 |
| 4,844,775 | 7/1989 | Keeble . |
| 4,863,549 | 9/1989 | Grunwald . |
| 4,925,542 | 5/1990 | Kidd . |
| 4,999,096 | 3/1991 | Nihei et al. . |
| 5,178,739 | 1/1993 | Barnes et al. . |
| 5,401,350 | 3/1995 | Patrick et al. . |
| 5,431,799 | 7/1995 | Mosely et al. . |
| 5,449,432 | 9/1995 | Hanawa . |
| 5,468,296 | 11/1995 | Patrick et al. . |
| 5,540,800 | 7/1996 | Qian . |
| 5,540,824 | 7/1996 | Yin et al. . |
| 5,560,776 | 10/1996 | Sugai et al. . |
| 5,569,363 | 10/1996 | Bayer et al. . |
| 5,747,384 | 5/1998 | Miyamoto . |
| 5,755,888 | 5/1998 | Torii et al. ............................. 118/719 |
| 5,834,371 | 11/1998 | Ameen et al. . |

FOREIGN PATENT DOCUMENTS

| | | |
|---|---|---|
| 0536664 | 4/1993 | European Pat. Off. . |
| 61-190070 | 8/1986 | Japan . |
| 08176823 | 7/1996 | Japan . |

*Primary Examiner*—Maria Nuzzolillo
*Assistant Examiner*—Julian A. Mercado
*Attorney, Agent, or Firm*—Wood, Herron & Evans, L.L.P.

[57] ABSTRACT

A method is provided of cleaning device surfaces for the metallization thereof by treating the surfaces in a chamber equipped for ionized physical vapor deposition or other plasma-based metal deposition process. The surfaces are plasma etched, preferably in a chamber in which the next metal layer is to be deposited onto the surfaces. Also or in the alternative, the surfaces are plasma etched with a plasma containing ions of the metal to be deposited. Preferably also, the etching process is followed by depositing a film of the metal, preferably by ionized physical vapor deposition, in the chamber. The metal may, for example, be titanium that is sputtered from a target within the chamber. The process of depositing the metal, where the metal is titanium, may, for example, be followed by the deposition of a titanium nitride layer. The process steps may be used to passivate the surfaces for transfer of the substrate containing the device surfaces through an oxygen or water vapor containing atmosphere or through another atmosphere containing potential contaminants such as through the transfer chamber of a cluster tool to which are connected CVD or other chemical processing modules. In the preferred embodiment, etching is achieved by maintaining a high ion fraction and high bombardment energy, for example, by applying a high negative bias to the substrate, operating the plasma in a net etching mode, then, by lowering the bombardment energy, for example by lowering the bias voltage, or by lowering the ion fraction, such as by increasing sputtering power, or decreasing plasma power, chamber pressure, a net deposition of the metal by IPVD is brought about.

22 Claims, 2 Drawing Sheets

FIG. 3

IN-SITU PRE-METALLIZATION CLEAN AND METALLIZATION OF SEMICONDUCTOR WAFERS

This invention relates to the cleaning of electrical device surfaces in preparation for the deposition of a metallization layer and to the deposit of the initial film of the metallization layer thereon.

BACKGROUND OF THE INVENTION

The manufacture of semiconductor devices and integrated circuits involves the blanket and selective deposition and removal of many layers of conductive, insulating and semi-conductive materials on substrates that are usually in the form of silicon wafers. The manufacturing processes typically include the formation of a series of metal interconnect film stacks on a wafer by a plurality of sequential processes performed in a series of processing chambers of one or more multi-process vacuum processing tools. Between the formation of the various stacks of the series, wafers are typically removed from a vacuum processing tool and a photo-resist pattern is applied thereto. The application of the pattern is followed by reactive etching processes that are rendered selective by the pattern. By these processes, troughs and/or holes through insulating layers on the underlying stack are formed, exposing contact areas on underlying conductors that are to be connected to the conductors of devices of subsequently applied overlying layers. Before such layers are applied, the masking layer may be removed.

Following selective etching and, in the case of the first metal layer also following an ion implantation process, patterned wafers are reintroduced into a processing tool where a subsequent stack of conductive layers is applied. The lowermost layer of the new stack to be applied is usually a layer of a reactive elemental metal such as titanium, chromium or tantalum, but may also be a metal nitride, silicide or alloy. One function of this lowermost metal layer is to form a bond or contact with an exposed conductive layer, such as silicon or metal, at the bottom of a contact hole in the underlying insulator. The bond serves to form the initial film portion of a conductive path between the underlying layer and the conductor of a new layer of the new stack.

Before the metallization layer is applied, however, it is usually necessary to clean from the wafer native oxides and other contaminants that characteristically formed on the contacts during prior processes or when the wafer was transferred through atmosphere from tool to tool. Even if such wafers were transferred under vacuum, the vacuum is not perfect so contaminating layers of atoms and molecules usually have formed on the surfaces of the contacts in proportion to the exposure duration. Such contaminating layers would, if not removed, interfere with the application of the metallization layer, usually resulting in degraded conductivity between the contact and the metallization layer.

The standard approach to dealing with the problem of contaminants on a contact surface is to subject the wafer to an inductively coupled plasma (ICP) soft sputter etch step immediately before initiating the metallization process. Such a soft etch step is typically carried out by first transferring the wafer, after placement into a vacuum processing tool in which the new stack is to be applied, into a soft etch chamber. In the soft etch chamber, a plasma is formed of an inert gas, usually argon. Then the plasma ions are electrically accelerated toward the wafer, usually by applying a bias to the wafer. The contaminant materials removed from the contacts by sputtering redistribute through the process chamber or onto the walls of high aspect ratio features, where they do not interfere with the subsequent electrical contact. Such a soft sputter etch is additionally beneficial in that it produces a uniform repeatable surface that facilitates the manufacturable deposition of PVD and CVD films.

The argon soft etch is not an ideal cleaning process since it cleans only by physical removal of contaminants afforded by sputtering. Such sputtering can damage the structure to be cleaned or the underlying device structures, either due to the mechanical sputtering action or through the accumulation of charge. Further, the argon is chemically inert and thus does not react with or chemically reduce the native oxides and other contaminant materials that are to be cleaned from the wafer surface.

Additions of reactive gases to the soft etch plasma have aided in the removal of contaminants from the contacts during soft etch cleaning, but have generally been found undesirable in other ways, particularly since these gases tend to migrate out of the process area and contaminate other portions of the process tool. Further, reactive components such as hydrogen can damage collateral device structures since hydrogen and other commonly used reactive components readily diffuse through the wafer.

In addition, freshly soft etched surfaces can be recontaminated in a processing tool by gases such as water vapor and oxygen from normal outgassing and from gases originating from CVD process modules. Further, the need for separate etch and deposition modules adds to the product cost and to the size of the processing equipment.

Accordingly, there is a need for a more effective and less costly process for preventing oxides and other contaminants from interfering with the metallization of surfaces at which contacts on the lowermost layer of a stack or other interconnects are to be formed, for example, on intra-stack layers that are otherwise prone to oxidation or contamination with water vapor or other material prior to the metallization of the such surfaces.

SUMMARY OF THE INVENTION

A primary objective of the present invention is to provide a method of cleaning the surface of a semiconductor wafer prior to the metallization thereof that overcomes the disadvantages of process sequences of the prior art that employ soft sputter or hard etch processes, or that have avoided etch-based precleaning that would otherwise be beneficial. A more particular objective of the present invention is to provide an improved method of cleaning contacts of semiconductor wafers for metallization. A still further objective of the present invention is to improve the efficiency and reduce the cost of semiconductor wafer processing.

According to principles of the present invention, cleaning of contacts and other surfaces for metallization is carried out in situ, that is, in the same chamber used for metal depositions in the following metallization process, without removing the wafer from the chamber between the cleaning and coating processes and preferably without venting the chamber to atmosphere. The cleaning is carried out by a soft sputter etch with ions of an inert gas such as argon. Preferably, the cleaning is carried out by the use of a plasma that includes ions of the material to be deposited in the metallization process.

According to further principles of the present invention, the cleaning of the contacts or other surfaces for metallization is carried out using a plasma formed in part at least by the same material that is to be used for metallization of the contacts, preferably with the cleaning and metallization being carried out in the same chamber, which is preferably an ionized physical vapor deposition (IPVD) chamber in which metallization is carried out by IPVD.

According to further principles of the invention, the cleaning of a substrate, particularly contacts or other surfaces thereon that are to be metallized, is carried out and then those surfaces are capped by deposition of a layer of metallization material. For example, the contacts are soft sputter etched with argon ions or argon and titanium ions followed immediately by the deposition of titanium, such as by IPVD, which may also be followed by a deposition of TiN, before the substrate is subjected to exposure to a potentially contaminating environment, such as the atmosphere of a transfer chamber of a CVD module, an external ambient atmosphere or such other atmosphere from which contamination could result.

Preferably, the surface of the substrate is first bombarded with ionized metal at an energy level that results in a net etching of the surface of the substrate, particularly the contacts or other surfaces to be metallized. Then, a film of the same metal is preferably deposited by an ionized physical vapor deposition (IPVD) process, following reduction of the energy level of the ions so that there is a net buildup of the material on the surface.

In accordance with one preferred embodiment of the invention, the surface to be cleaned for metallization is bombarded with titanium ions in an IPVD chamber. Preferably, the titanium is produced by the sputtering of a titanium target with an argon plasma, and the titanium particles that are ejected from the target surface are then ionized by passing the sputtered titanium particles through a dense inductively coupled plasma (ICP) or electron cyclotron resonance (ECR) plasma, for example. While these methods of generating the material ionizing plasma are preferred, helicon, hollow cathode and a number of other methods of generating a plasma may also be employed. The ionized titanium atoms and other ionized sputtered titanium particles are then accelerated toward the substrate by electrically biasing the substrate to a negative potential.

In the preferred method of the invention, the particles are initially directed toward the substrate with a relatively high ion fraction and relatively high bombardment energy so that a net etching effect is achieved on the substrate surface. This etching removes native oxides, water and other contaminants that may have accumulated on the substrate prior to or during transport into the IPVD chamber. Preferably following etching with titanium ions, the energy of the titanium ions is reduced, such as by reducing the biasing voltage, so that a net deposition of a titanium film is produced on the surface of the substrate. Alternately, the Ti ion fraction can be reduced by other means including decreasing the ICP power or Ar pressure or by increasing the metal sputter cathode power. In effect, an ionized PVD of the titanium is used to carry out a combination of a precleaning of the wafer and the deposition of the first metal film.

In accordance with the preferred embodiment of the invention, the high energy titanium metal atoms simultaneously sputter clean and react with the surface contaminants. The process takes advantage of the fact that the titanium, unlike neutral argon, reacts with and chemically reduces the oxides and as a film has a high solubility for the oxygen. Further, the titanium atoms, which have a higher atomic mass than atoms of argon, are particularly effective for cleaning contacts at the bottoms of high aspect ratio holes since they are scattered less by gas phase collisions and therefor remain more closely aligned normal to the surface of the wafer.

Alternatively, certain advantages of the invention can be realized by controlling the bias voltage on the wafer or using other techniques to direct the ions of the metal to the wafer in such a way that the cleaning with the metal and coating with the metal overlap or occur simultaneously. For example, by reducing or eliminating the change in biasing voltage and rather using a voltage that balances the cleaning and coating rates appropriate to the asperity of the feature to be cleaned, effective cleaning and coating with titanium or titanium nitride can be achieved. However, sequentially cleaning and then coating in the manner described above effectively produces the advantages of the invention for most applications and is preferred for simplicity.

Preferably, the invention is carried out according to an IPVD method and apparatus as disclosed in one or more of copending U.S. patent application Ser. Nos. 08/837,551, 08/844,756 and 08/844,757 filed Apr. 21, 1997 and U.S. patent application Ser. No. 08/861,958 filed May 22, 1997, all hereby expressly incorporated by reference herein. The IPVD chamber may use a metal, such as titanium, titanium nitride, tantalum or another metal or compound compatible with the substrate and intended overlying materials, for both cleaning of the substrate and for the initial coating of the substrate. The IPVD chamber is preferably provided as one processing module of a cluster tool and arranged to connect to the transfer module of the tool, to which is also connected a processing module, such as a CVD module, for the application of a metallization layer such as tungsten, aluminum or copper.

A titanium nitride film, once deposited, is resistant to reaction with oxygen or water vapor, and is generally more stable than the contacts which have been only soft etch cleaned with an argon plasma. In addition, a titanium film has a large capacity to buffer disadvantageous effects on exposure to such substances. As a result, wafers can be transferred from the tool through the transfer module of a CVD apparatus with less likelihood of undergoing further contamination. The transfer modules of CVD reactors often contain levels of contaminants from the CVD processing chambers to which they are attached. Contaminants often found in such transfer chambers include, for example, $TiCl_4$, $NH_3$, $NF_3$, $H_2$, and MOCVD precursors such as tetrakis di-methyl amino titanium (TDMAT). IPVD diffusion barriers such as TiN can, for example, resist contamination by such substances when the wafers are being transferred through the transfer chamber of the CVD tool.

With the combined Ti-ion cleaning and initial Ti film deposition followed by TiN deposition performed in the same chamber, the invention is therefore useful for intrastack as well as inter-stack applications. For example, transfer of a Ti-ion cleaned and coated wafer, according to the present invention, can be effectively transferred through the transfer chamber of a cluster tool and into a CVD module for the deposition of tungsten with less likelihood of undergoing contamination in the transfer chamber than would an argon soft etch cleaned wafer.

Similarly, IPVD cleaned and deposited metal nitrides or other metals such as a tantalum can be similarly used with the present invention. For example, a Ta-ion cleaning and IPVD Ta and TaN deposition can be performed on a wafer in an IPVD module of a processing tool prior to the transfer of the wafer through the tool transfer chamber to a CVD module of the tool for the deposition of copper.

With the present invention, not only is a superior cleaning and contamination preventing process provided, but both the cleaning and initial metal film deposition processes are carried out in an IPVD module, while the requirement for a soft etch module is eliminated. As a result, processing efficiency is increased, equipment cost is reduced, and equipment footprint is also reduced. Alternately, the vacant process station can be filled with another processing module to increase throughput or deposit a film stack having an additional component.

These and other objects and advantages of the present invention will be more readily apparent from the following detailed description of the preferred embodiments of the invention.

DETAILED DESCRIPTION OF THE PREFERRED EMBODIMENT

Figure 1:
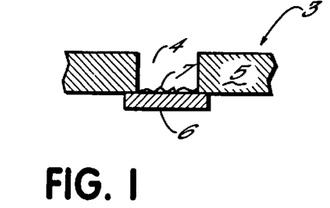
FIG. 1 is a cross-sectional diagram of an electrical contact in a typical condition prior to cleaning.
Figure 2:
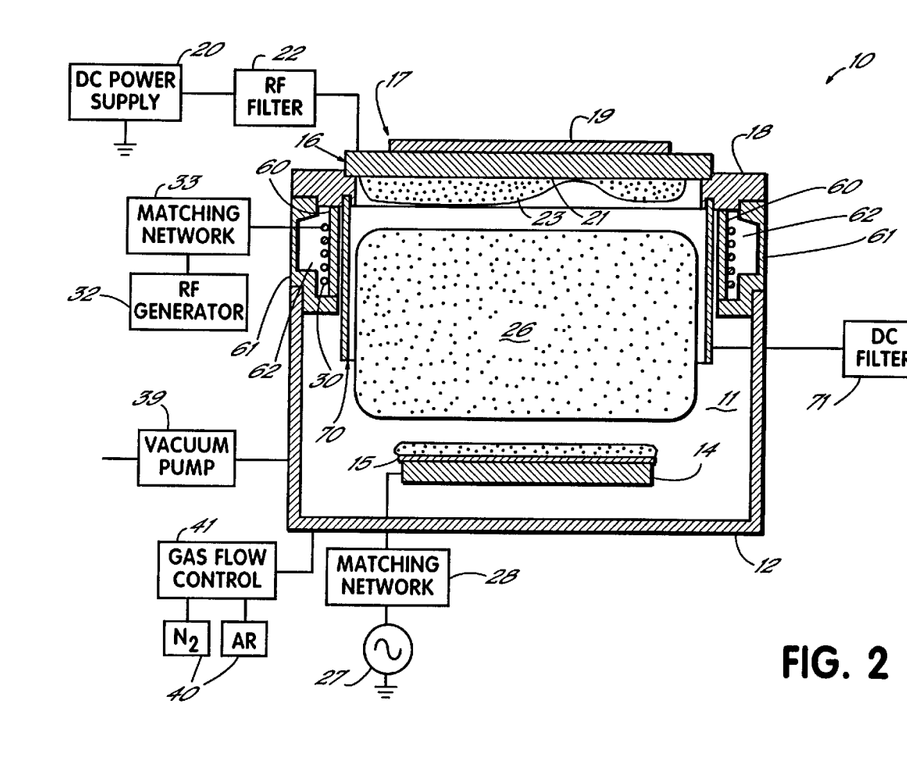
FIG. 2 is an elevational diagrammatic representation of an IPVD sputtering apparatus and precleaning module for use according to one embodiment of the present invention.

FIG. 1 is a simplified cross-sectional diagram through a stack on a semiconductor wafer 3 showing a hole 4 through an insulating layer 5 thereon exposing a conductor 6 at the bottom of hole 4 which is to form an interconnect with an overlying conductor that is yet to be applied. Following the formation of the hole 4, the wafer 3 would have typically been transferred, either through atmosphere or through a transfer module containing contaminating gases, to a processing module such as the module 10 (FIG. 2). During the transfer a contaminating layer 7 would have been typically formed, which layer 7 must be removed before an acceptable interconnect with an overlying layer can be applied.

Figure 1A:
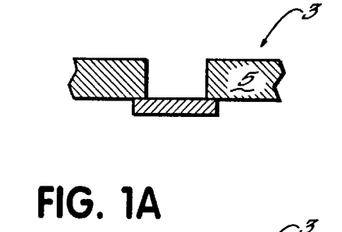
FIG. 1A is a diagram, similar to FIG. 1, of the contact following cleaning.
Figure 1B:
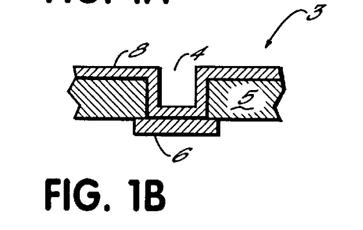
FIG. 1B is a diagram, similar to FIGS. 1, and 1A, of the cleaned electrical contact following coating.

FIG. 1A illustrates the same hole 4 through the insulating layer 5 of the wafer 3 following removal of the contaminating layer 7 during a cleaning process to expose the underlying conductor 6 for interconnection with a conductor of a new stack. FIG. 1B illustrates a cleaned contact 6 at the bottom of the hole 4 through the insulating layer 5 of the wafer 3, following application of a subsequent coating layer 8. This coating layer may be a layer of a metal such as titanium or may be a titanium nitride (TiN) layer, which is commonly applied immediately over a titanium metal layer. Such a coating layer is typically used as a barrier layer prior to the application of a subsequent metal layer such as tungsten in a subsequent process which will serve as a conductor of the upper stack which makes the interconnection with the conductor 6 to form a contact in the hole 4.

FIG. 2 diagrammatically illustrates a precleaning module 10 according to principles of the present invention. The module 10 is an Ionized Physical Vapor Deposition (IPVD) apparatus such as that illustrated and described, for example, in U.S. patent application Ser. No. 08/844,756, filed on Apr. 21, 1997, which is expressly incorporated by reference herein. The module 10 includes a vacuum tight processing space 11 enclosed in a chamber 12. Mounted in the chamber 12 at one end thereof is a wafer support or susceptor 14 for supporting a semiconductor wafer 15 mounted thereon. The wafer 15, when mounted on the support 14, is parallel to and faces a target 16. The target 16 is formed of a sputter coating material, for example, titanium metal. The processing space 11 is a generally cylindrical space that is maintained at an ultra high vacuum pressure level and is filled with a processing gas, such as argon, during processing, and may include some other gas such as nitrogen. The space 11 lies in the chamber 12 between the support 14 and the target 16.

The target 16 is part of a cathode assembly 17 mounted in the chamber 12 at an end thereof opposite the substrate holder 14. The cathode assembly 17 includes a target holder 18 to which the target 16 is secured. A magnet structure 19 is typically provided behind the target holder 18 on the opposite side thereof from the support 14. A dark space shield (not shown) may also be provided around the periphery of the target 16. The magnet structure 19 preferably includes magnets that produce a closed magnetic tunnel over surface 21 of the target 16 that traps electrons given off into the chamber 12 by the cathode assembly 17 when it is electrically energized to a negative potential as is familiar to one skilled in the art. The magnet pack 19 may include fixed or rotating or otherwise moving magnets, which may be permanent or electromagnets, of any one of a number of magnetron sputtering assemblies known in the art, but is preferably that described and illustrated in U.S. Pat. No. 5,130,005, expressly incorporated by reference herein. The magnetic tunnel produced by the magnet pack 19 traps and shapes a plasma 23 which sweeps over the surface 21 of the target 16 as the magnet pack 19 rotates.

A power supply or source 20 of electrical energy, preferably a source of DC power, which may be switched on to remain constant or may be pulsed, is connected between the cathode assembly 17 and the wall of the chamber 12, which is usually grounded and serves as the system anode. The cathode assembly 17 is insulated from the wall of the chamber 12. The power supply 20 is preferably connected to the cathode assembly 17 through an RF filter 22. A bias power supply or generator 27 is provided and connected to the substrate holder 14 through a matching network 28. The bias power supply 27 applies a bias voltage to a wafer 15 mounted on the holder 14.

Power from the power supply 20 produces a negative potential on the target 16. The negative potential accelerates positive ions from the plasma 23 toward surface 21 of the target 16 which, upon impact, cause electrons to be emitted from surface 21 of the target 16. These electrons become trapped over the surface 21 of the target 16 by the magnetic field generated by the magnet pack 19, until, eventually, the electrons strike and thereby ionize atoms of process gas in close proximity to the surface 21 of the target 16, forming plasma 23 adjacent to the target surface 21. This main plasma 23 becomes a source of positive ions of gas that are accelerated toward and against the negatively charged surface 21, where they eject particles of coating material from the target 16.

The space 11 between the target surface 21 and the substrate support 14 can be considered as formed of two parts. One part is that primarily occupied by the plasma 23, which is shaped to produce a desired erosion pattern on the sputtering surface 21 of the target 16, while the second part of the space 11 is a remaining volume 26 that lies between the plasma 23 and the substrate 15 on the support 14. The particles of sputtered material from the target 16 generally originate as electrically neutral particles that propagate by momentum only through the space 11. In a conventional sputtering apparatus, neutral sputtered particles passing through the plasma 23 are not ionized significantly since the plasma 23 occupies a small volume near target surface 21, and at operating pressures of interest, few collisions occur between the neutral sputtered particles and particles of the plasma 23. As such, the neutral sputtered particles exit the plasma 23 mostly neutral and stay neutral until deposited as a thin film on substrate 15.

For depositing a film of target material on the substrate 15 by IPVD, sputtered particles are ionized as they pass through volume 26, so that the particles of sputtered material from the target 16, for example, particles of titanium metal, develop an electrical charge. Once charged, the particles can be electrostatically accelerated or otherwise electrically or magnetically directed into paths that are parallel to the axis of the chamber and perpendicular to the surface of the substrate 15. In-flight ionization of sputtered particles in the space 11 is carried out by inductively coupling RF energy into the volume 26 from an RF coil 30 that surrounds the volume 26 and preferably lies outside of the chamber 12, surrounding the chamber 12. The coil 30 is preferably in the form of a helical coil assembly, though coil configurations other than helical may be used.

The coil 30 inductively couples energy into process gas in the volume 26, forming an inductively coupled plasma (ICP) that generally fills the space 26. An RF generator 32, preferably operative in the range of from 0.2 to 60 MHz, for example of a frequency of 2 MHz, is connected to the coil 30 through a matching network 33 to provide the energy to the coil 30 to form the plasma in the volume 26.

Sources of processing gas 40, such as argon and nitrogen, are connected to the chamber 11, through a flow control device 41. A high vacuum pump 39 is also connected to the chamber 12 to pump the chamber to a vacuum in the milli Torr or sub-milli Torr range. Pressures in the 5 to 30 milli Torr range, for example of 10 milli Torr, are preferred. The pump 39 maintains the ultra high vacuum with a flow rate of process gas preferably in the range of from 5 to 100 or 150 standard cubic centimeters per second (sccm).

In the wall of the chamber 12, between the coil 30 and the space 11 there is provided a protective dielectric window 60. The window 60 is formed of a vacuum compatible dielectric material such as quartz or other material that does not impede the magnetic field surrounding the coil 30 from reaching into the volume 26. The window 60 is mounted to form a vacuum tight seal with the wall of the chamber 12. The window 60 is preferably a single cylindrical piece of electrically insulating and magnetically-transparent material, but it may be formed of joined segments of material arranged to form a generally cylindrical protective structure in the form of electrically insulating windows in an enclosing structure. The coil 30 is preferably wound around the chamber 12 outside of the window 60. Covering the coil 30 on the outside thereof is a conductive metal enclosure 61, which forms a sealed cavity 62, which isolates the coil 30 and also prevents electromagnetic energy from radiating from the coil 30 and from within the chamber 12 to the outside of the chamber 12. A space 62 within the enclosure 61 may be in communication with the outside atmosphere or may be filled with inert gas, at atmospheric or low pressure, provided that formation of a plasma is not supported by the gas in the cavity 62 when the coil 30 is energized.

While the window 60 itself is not electrically conductive, it is susceptible to the accumulation of a coating of conductive material sputtered from the target 16. Electrical conductivity in or on the window 60 supports the induction of azimuthal currents around the chamber which reduce, cancel or otherwise undermine the effectiveness of the RF coupling of energy from the coil 30 to the plasma in the volume 26. Such conductivity of coating on the window 60, particularly in the azimuthal (circumferential) direction, that is, a direction that extends around the chamber 12, produces an inductively coupled short circuit, can negate all or much of the energy inductively coupled into the volume 26.

To prevent such buildup of conductive sputtered material on the window 60, a slit cylindrical shield 70 is provided between the space 11 and the window 60, in close proximity to the inside surface of the window 60. The shield 70 shadows the window 60 from material sputtered from the target 16, and preferably blocks all direct line-of-sight paths between any point on the surface 21 of the target 16 and the window 60. Further according to the preferred embodiment of the present invention, the shield 70 has a longitudinal slit therein that is parallel to the axis of the chamber 12. Shields with a single or plurality of slits fashioned to interrupt eddy currents can also be used. The slit in the shield 70 substantially interrupts circumferential paths in the shield 70 around the chamber 12. This prevents the induction of circumferential or azimuthal currents in the shield 70.

In addition, the shield 70 has an axial extent beyond the axial extent of the coil 30 that reaches substantially the full effective axial extent of the field from the coil 30. The shield 70 is connected through a DC filter 71 to remove plasma induced DC potential from the shield 70. As a result, the electrically conductive shield 70 effectively suppresses electric fields in the RF plasma that are parallel to the axis of the chamber 12, preventing such axial electric fields that would capacitively shield the coil 30 from the volume 26 and thereby undermine the coupling efficiency of energy to the volume 26 from the coil 30. It is preferred that the shield 70 extend axially from behind the plane of the surface 21 of the target 16 to beyond the window 60 and coil 30. With this configuration, the shield 70 more effectively shorts out axial electric fields in the plasma, thereby enhancing the inductive coupling of energy from the coil 30 into the plasma 26.

The preferred embodiment of the invention also produces a high coupling efficiency of energy from the coil 30 into the volume 26 due to a close spacing of the shield 70 from the window 60. This spacing is maintained at a distance that is preferably not more than the mean free path of atoms or molecules in the gas or the minimum diffusion length of the plasma within the chamber 12. This close shield-to-window spacing is in contrast to other proposals which permit formation of plasma adjacent a window or coil protecting non-conductive structure and behind any shield structure that is provided. Such methods have a tendency of reducing the percentage of energy from the coil or other plasma generating electrode into volume through which the sputtered particles pass, thereby reducing the effective plasma and thus the ionization efficiency of the sputtered material. In the apparatus 10, it is contemplated that processing gas pressures in the range of about 5 to 30 milli-Torr will be used for IPVD of titanium. The mean free path of argon gas at such pressures is from 7 mm to 1.0 mm, respectively. As a result, the preferred spacing of the shield 70 from the window 60 is approximately 1.0 to 10 mm.

On the other hand, the slit in the shield 70 is preferably made greater than approximately 15 mm in width. The width of the slit is sufficiently wide to allow plasma to form in the slit in order to clean sputtered material that might deposit on the edges of the shield 70 adjacent the slit, or on the window 60 as a result of sputtered material that passes through the slit. Such plasma that forms in the slit will extend against the window 60 in the vicinity of the slit and continuously remove, by resputtering the material that deposits on the window 60 at the slit.

When the module 10 is used for IPVD of a metal such as titanium from the target 16 onto the substrate 15, to achieve directionality of the ionized sputtered particles, an electrical potential gradient may be maintained in the IC-plasma in the space 26 in front of substrate holder 14 by negatively biasing the substrate 15 relative to the plasma with the bias power supply 27, to provide force to accelerate the positively ionized sputtered particles toward and onto the substrate surface. This power supply 27 is preferably an RF generator that operates in the range of from about 0.2 to 80 MHz, for example, at 13.56 MHz. For such a titanium IPVD process, cathode power applied by the power supply 20 to the target 16 is in the range of from 500 to 5000 watts. For a 12 inch diameter target, the power is typically about 1.5 kWatts. The ICP power applied by generator 32 is preferably in the range of 250 to 5000 watts, typically 2.5 kWatts. The bias of the substrate 15 is preferably in the range of 20 to 100 negative volts, typically –40 volts.

The module 10 can be used as an ICP soft etch cleaning module by de-energizing the power supply 20 to the target 16 and, with only argon from the source 40 introduced into the chamber 12, producing an IC-plasma in the space 26 with energy from the RF generator 30 applied to the coil 60. The argon ions produced in the plasma in the space 26 can be accelerated toward the substrate 15 by the bias applied by the bias power supply or generator 27. These ions will strike the surface of the substrate 15 to clean the surface of the substrate 15. Such a process can be used to clean a contact that is in the condition illustrated in FIG. 1 to produce a cleaned contact as illustrated in FIG. 1A.

In accordance with one preferred embodiment of the invention, the module 10 is operated to perform a plasma precleaning of the wafer 15. To so operate the module 10 is operated in a mode similar to that described above for IPVD of the metal, for example of titanium. In such operation, argon gas is maintained in the chamber 12 at approximately 10 milli Torr and ICP power from the generator 32 is increased to 3.5 kWatts, while the substrate bias applied by the generator 27 to the substrate 15 is increased to a negative of 50 to 100 volts. A low power of approximately 500 to 1500 watts is applied by the power supply 20 to the target 16.

Figure 1C:
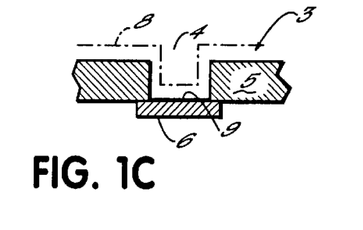
FIG. 1C is a diagram, similar to FIG. 1A, of the contact following cleaning with plasma that includes ions of a metal such as titanium.

As a result of such operation of the module 20, titanium is sputtered from the target 16 and is ionized in the ICP in space 26 along with atoms of the argon gas. The ions of titanium and argon are accelerated onto the substrate 15 by the bias voltage applied to the substrate. The heavier titanium ions that are included with the ions that bombard the substrate 15 effectively enhance the cleaning of native oxides and water vapor from the substrate surface and also react with the contaminants to reduce oxides on the surface and to dissolve oxygen into the titanium film. The parameters of target power, ICP power and substrate bias are maintained at a balance such that material is removed from the surface or diluted before the surface becomes covered with titanium, thereby performing a generally etching action. This etching action will be carried out for a time period of approximately 20 seconds. This ionized metal etching action, while cleaning the contact 6, will result in some depositing of metal atoms 9 on the surface of the contact 6, as illustrated in FIG. 1C.

Further in accordance with the preferred embodiment of the invention, when the etching period is completed, the parameters within the module 10 are adjusted more toward the typical parameters used for IPVD of the target material onto the substrate 15. For example, the cathode power is increased to approximately 1.5 kWatts, the substrate bias is reduced to approximately –40 volts and the ICP power is reduced to about 2500 watts. This setting of parameters results in a net deposition of a thin film of titanium on the substrate 15. This deposition is carried out for a period of approximately 30 seconds, for example. Such a Ti-IPVD clean process can be used to clean a contact that is in the condition illustrated in FIG. 1 to produce a cleaned and Ti-coated contact as illustrated in FIG. 1C, where the underlying conductor 6 is cleaned and has a small initial deposit 9 of titanium on the surface thereof, which is further coated with a thin film 8, which may be of titanium metal, for example, or of titanium metal followed by a layer of TiN.

Further in accordance with the preferred embodiment of the invention, a thin film of titanium nitride (TiN) is then deposited onto the substrate 15 over the film of elemental titanium. This is particularly preferred where the next layer to be formed on the substrate is that of CVD tungsten. Such a TiN layer may be formed in the module 10 by introducing nitrogen into the chamber 12. This nitrogen may then be reacted with titanium on the substrate surface according to the known methods of reactive sputter deposition of TiN, such as by thermally energizing the substrate 15 or by biasing the substrate 15 so as to form a plasma such as plasma 75 adjacent the surface of the substrate to stimulate a reaction between the nitrogen in the gas at the substrate surface and titanium impinging onto or deposited on the substrate 15. Alternatively, the TiN film may be deposited onto the substrate 15 following the deposition of the titanium in the module 10 by transferring the wafer 15 from the module 10 to a chamber for TiN deposition by a reactive sputtering or by a CVD process. The resulting interconnect is that illustrated in FIG. 1B.

Further in accordance with the preferred embodiment of the invention, following the titanium cleaning and deposition process, and following a further TiN deposition where present, the wafer is transferred to another tool or through a transfer chamber of the same tool to a processing chamber such as a CVD chamber for further processing, such as for deposition of tungsten or aluminum.

Figure 3:
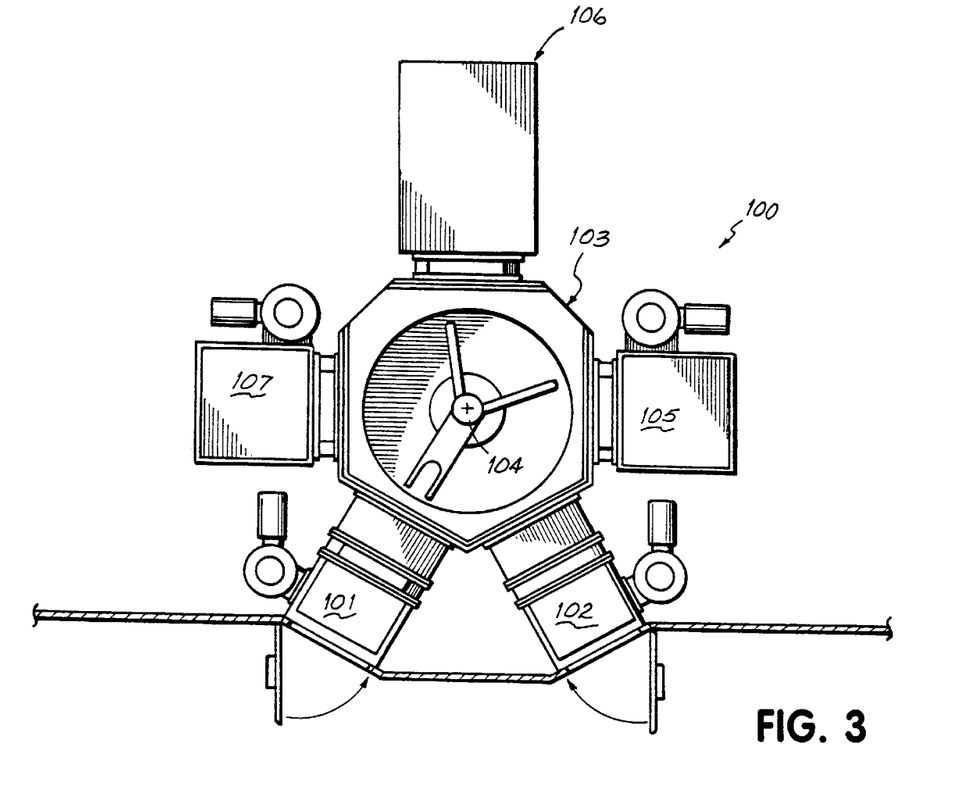
FIG. 3 is a plan view of a semiconductor wafer processing cluster tool according to one embodiment of the present invention.

FIG. 3, for example, diagrammatically illustrates a semiconductor wafer processing cluster tool 100 for carrying out certain of the embodiments of the methods described above. The tool 100 preferably includes a vacuum transfer module 103 to which are attached one or two loadlock modules 101,102 which are connected to two positions of the transfer module 103 having a conventional robot transfer arm 104 therein. The transfer module 103 is illustrated as having three additional positions to which are attached processing modules 105, 106 and 107, none of which need be a dedicated precleaning module. While only three such additional positions are illustrated, more may be provided or to one may be connected a further transfer module for transfer of substrates to other processing modules attached thereto.

In accordance with one preferred embodiment of the invention, the module 104 is a combined plasma pre-clean and plasma-based deposition module preferably of the type illustrated and described in connection with FIG. 2 above. The module 105 is controlled to operate, in the programmed sequence of the tool 100, as a plasma precleaning and first metal layer deposition module. The additional modules 106 and 107 are, for example, both deposition modules. The module 106 may, for example, be a CVD module for the deposition of a second film, such as tungsten or another material that is common in semiconductor device manufacture. The Next chamber 108 may be equipped for the PVD of another material. This additional chamber 108 may be a chamber that could not otherwise be attached to the transfer module 103 because its position would normally be occupied by a dedicated precleaning module, which has been eliminated by the present invention.

Those skilled in the art will appreciate that the implementation of the present invention herein can be varied, and that the invention is described in preferred embodiments. Accordingly, additions and modifications can be made without departing from the principles and intentions of the invention.

What is claimed is:

1. A method of preparing an electrical device surface for formation of an interconnection therewith in the manufacture of an electrical device, the method comprising the steps of:

providing a substrate having an electrical device surface thereon that has contamination on the device surface thereof in a processing chamber that is equipped for vapor deposition of the next metal layer to be deposited onto the device surface;

forming a plasma of inert gas in the chamber and ionizing therewith, in the plasma, initially neutral particles of the next metal to be deposited onto the surface by collision of the initially neutral particles of the metal with charged particles of the plasma to produce positive ions of the metal;

etching the device surface with the positive ions of the metal formed in the plasma by controlling the substrate-to-plasma potential and thereby accelerating the positive ions of the metal from the plasma toward and onto the device surface to clean from the device surface contaminants that might be present thereon; then forming a film of the metal on the device surface in the chamber by ionized physical deposition by controlling the substrate-to-plasma potential and thereby by electrically attracting the positive ions of the metal from the plasma and onto the surface without removing the substrate from the chamber.

2. The method of claim 1 wherein:

the etching step is conducted by maintaining process parameters such that the positive ions of the metal remove material from the surface or dilute material on the surface before the surface is covered by deposition of the metal onto the surface.

3. The method of claim 2 wherein:

the film forming step is conducted by maintaining process parameters such that the rate of deposition of the metal onto the surface is greater than the rate at which the metal ions etch the surface.

4. The method of claim 1 wherein the etching and film forming steps include the step of:

maintaining process parameters such that the ions of metal initially clean the surface and thereafter altering the process parameters such that metal ions or neutral metal particles build up a metal film of the metal on the surface.

5. The method of claim 1 wherein:

the method includes process parameters during etching and ionized physical vapor deposition including the parameters of ion fraction of the metal ions and bombardment energy of the metal ions:

the etching step is conducted by maintaining the ion fraction or the bombardment energy of the metal ions at levels that are high relative to those normally maintained for the physical vapor deposition of the metal onto a substrate.

6. The method of claim 5 wherein:

the film forming step is conducted by changing the parameters to reduce the removal rate of the metal ions from that maintained in the etching step.

7. The method of claim 6 wherein:

the process parameters further include a substrate bias, a plasma power applied to form the plasma, a pressure of gas within the chamber, and a sputtering power applied to a sputtering target that is a source the particles of metal;

the step of changing the parameters to reduce the removal rate of the metal ions from that maintained in the etching step is carried out by performing at least one step selected from the group of steps consisting of: reducing the bias of the substrate, reducing the ion fraction of metal ions in the plasma, reducing the power applied to form the plasma of the metal ions, lowering the pressure of the gas in the chamber, and increasing power to a sputtering target that is a source of the metal.

8. The method of claim 1 wherein:

the metal is titanium sputtered from a titanium target in the chamber;

the etching of the device surface is carried out with the plasma formed of positive ions of titanium sputtered from the target as neutral particles and ionized by collisions with electrons after being sputtered from the target; and the forming of the film of metal on the device surface in the chamber includes the step of forming a titanium containing barrier layer on the surface by ionized physical deposition of titanium onto the surface.

9. The method of claim 1 wherein:

the metal is tantalum sputtered from a tantalum target in the chamber;

the etching of the device surface is carried out with the plasma formed of positive ions of tantalum sputtered from the target as neutral particles and ionized by collisions with electrons after being sputtered from the target; and the forming of the film of metal on the device surface in the chamber includes the step of forming a tantalum containing barrier layer on the surface by the physical vapor deposition of tantalum onto the surface.

10. The method of claim 1 wherein:

the etching step includes the step of removing a contaminant selected from the group consisting of native oxides, water vapor, and residues from previous processes from the device surface with the plasma by chemically reacting the positive metal ions with the contaminant at the device surface.

11. The method of claim 1 wherein:

the electrical device surface has contaminants thereon selected from the group consisting of native oxides and water vapor; and the etching step includes the step of removing native oxides or water vapor from the device surface with positive ions of the metal formed with the plasma.

12. A method of protecting a surface on an electrical device against contamination during transfer of a substrate containing the device through a potentially contaminating atmosphere comprising:

providing a substrate having an electrical device surface thereon that has contamination on the device surface thereof in a processing chamber that is equipped for physical vapor deposition of the next metal layer to be deposited onto the device surface;

forming a plasma of inert gas in the chamber;

etching the device surface with positive ions formed in the plasma to clean from the device surface contaminants that might be present thereon; then forming a first film barrier layer of reactive elemental metal on the cleaned device surface in the chamber by the physical vapor deposition of metal onto the surface without removing the substrate from the chamber and then forming a passivated layer of the metal of the deposited metal first film barrier layer;

transferring the wafer from the chamber in which the etching and film forming steps were carried out and through the potentially contaminating atmosphere and into a further deposition chamber; and in the further deposition chamber, depositing a further film over the passivated metal first film layer on the surface without further cleaning of the surface.

13. The method of claim 12 wherein:

the substrate providing step includes the step of placing the substrate into the chamber with the electrical device surface thereon having been contaminated by exposure to contamination prior to placement into the chamber.

14. The method of claim 12 wherein:

the metal is titanium;

the film forming process includes the deposition of titanium onto the device surface and the deposition of a film of titanium nitride over the titanium on the device surface; and the step of depositing a further film over the metal film includes the step of performing chemical vapor deposition of tungsten over the titanium nitride film.

15. The method of claim 12 wherein:

the metal is titanium;

the film forming process includes the deposition of titanium onto the device surface and the PVD or CVD of a film of titanium nitride over the titanium on the device surface; and the step of depositing a further film over the metal film includes the step of performing the PVD or CVD of aluminum over the titanium nitride film.

16. The method of claim 12 wherein:

the metal is tantalum;

the film forming process includes the deposition of tantalum onto the device surface and the PVD or CVD of a film of TaN over the tantalum on the device surface; and the step of depositing a further film over the metal film includes the step of performing the PVD or CVD of copper over the tantalum nitride film.

17. A method of preparing an electrical device surface for formation of an interconnection therewith in the manufacture of an electrical device, the method comprising the steps of:

placing a substrate having an electrical device surface thereon into an IPVD sutter processing chamber that is equipped for ionized physical vapor deposition of metal from a magnetron sputter cathode assembly having a sputtering target formed of the metal onto a device surface of the substrate;

ejecting neutral particles of the metal from the target by applying negative potential to the target and sputtering the target with positive ions of process gas formed by electrons in a sputtering plasma trapped adjacent the target by magnets of the magnetron sputter cathode;

forming a dense inductively coupled plasma in the chamber with the process gas therein at a pressure of at least 5 mtorr and ionizing therewith the neutral particles of the metal to form positive ions of the metal in the inductively coupled plasma; and etching the device surface by accelerating positive ions of the metal from the inductively coupled plasma toward and onto the device surface to clean the device surface with the positive metal ions formed with the plasma.

18. The method of claim 17 further comprising the step of:

forming a barrier layer film of the metal on the device surface in the chamber by accelerating the positive ions of the metal toward and perpendicular to the device surface and onto contacts at the bottoms of high aspect ratio features on the device surface of the substrate to coat the contacts by the ionized physical deposition of the metal onto the surface.

19. The method of claim 18 wherein the etching step includes the step of:

maintaining process parameters such that the positive ions of metal clean the surface of the substrate; and then altering the process parameters such that the positive ions of the metal build up a film of the metal on the surface of the substrate.

20. The method of claim 17 wherein:

the metal is titanium sputtered from a target in the chamber;

the etching of the device surface is carried out with the plasma formed of ions of titanium sputtered from the target.

21. The method of claim 17 wherein:

the metal is tantalum sputtered from a target in the chamber;

the etching of the device surface is carried out with the plasma formed of ions of tantalum sputtered from the target.

22. The method of claim 17 wherein:

the etching step includes the step of cleaning contacts on the device surface by directing ions of the metal thereon.

* * * * *

UNITED STATES PATENT AND TRADEMARK OFFICE
CERTIFICATE OF CORRECTION

PATENT NO.    : 6,132,564
DATED         : October 17, 2000
INVENTOR(S)   : Licata It is certified that error appears in the above-identified patent and that said Letters Patent is hereby corrected as shown below:

<u>Column 4,</u>
Line 1, reads "therefor" and should read -- therefore --.

<u>Column 8,</u>
Line 58, reads "milli-Torr" and should read -- milli Torr --.

<u>Column 11,</u>
Line 2, reads "The Next chamber" and should read -- the next chamber --.

<u>Column 12,</u>
Line 12, reads "that is a source the" and should read -- that is a source of the --.

Signed and Sealed this

Twenty-fifth Day of May, 2004

JON W. DUDAS
*Acting Director of the United States Patent and Trademark Office*